United States Patent

Liu et al.

(10) Patent No.: US 8,309,398 B2
(45) Date of Patent: *Nov. 13, 2012

(54) ELECTRONIC DEVICE WAFER LEVEL SCALE PACKAGES AND FABRICATION METHODS THEREOF

(76) Inventors: Chien-Hung Liu, Taoyuan (TW); Sih-Dian Lee, Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/152,891

(22) Filed: Jun. 3, 2011

(65) Prior Publication Data

US 2011/0237018 A1 Sep. 29, 2011

Related U.S. Application Data

(63) Continuation of application No. 11/987,232, filed on Nov. 28, 2007, now Pat. No. 7,981,727.

(30) Foreign Application Priority Data

Aug. 24, 2007 (TW) .............................. 96131455 A

(51) Int. Cl.
*H01L 21/00* (2006.01)
*H01L 21/78* (2006.01)
(52) U.S. Cl. .......... 438/113; 438/73; 438/110; 438/114; 257/E21.599
(58) Field of Classification Search .................... 438/73, 438/458, 459, 113, 110, 114, 460, 461, 462, 438/464, 465; 257/E21.088, E21.599, E31.11, 257/E21.523
See application file for complete search history.

(56) References Cited

U.S. PATENT DOCUMENTS

| | | | |
|---|---|---|---|
| 6,624,505 B2 | 9/2003 | Badehi | |
| 6,972,480 B2 | 12/2005 | Zilber et al. | |
| 7,271,466 B2 | 9/2007 | Noma et al. | |
| 7,340,181 B1 | 3/2008 | Prabhu et al. | |
| 7,394,152 B2 | 7/2008 | Yu et al. | |
| 7,399,683 B2 | 7/2008 | Noma et al. | |
| 7,413,931 B2 | 8/2008 | Noma et al. | |
| 7,557,017 B2 | 7/2009 | Yamada et al. | |
| 7,981,727 B2 * | 7/2011 | Liu et al. ...................... | 438/113 |
| 2001/0018236 A1 | 8/2001 | Badehi | |
| 2003/0179415 A1 | 9/2003 | Yasuda | |
| 2005/0009238 A1 | 1/2005 | Okigawa | |

(Continued)

FOREIGN PATENT DOCUMENTS

CN 1664991 A 9/2005

*Primary Examiner* — William D Coleman
*Assistant Examiner* — Christine Enad
(74) *Attorney, Agent, or Firm* — Birch, Stewart, Kolasch & Birch, LLP

(57) ABSTRACT

Electronic device wafer level scale packages and fabrication methods thereof. A semiconductor wafer with a plurality of electronic devices formed thereon is provided. The semiconductor wafer is bonded with a supporting substrate. The back of the semiconductor substrate is thinned. A first trench is formed by etching the semiconductor exposing an inter-layered dielectric layer. An insulating layer is conformably deposited on the back of the semiconductor substrate. The insulating layer on the bottom of the first trench is removed to create a second trench. The insulating layer and the ILD layer are sequentially removed exposing part of a pair of contact pads. A conductive layer is conformably formed on the back of the semiconductor. After the conductive layer is patterned, the conductive layer and the contact pads construct an S-shaped connection. Next, an exterior connection and terminal contact pads are subsequently formed.

10 Claims, 7 Drawing Sheets

U.S. PATENT DOCUMENTS

| | | |
|---|---|---|
| 2005/0095750 A1 | 5/2005 | Lo et al. |
| 2005/0208735 A1 | 9/2005 | Noma et al. |
| 2006/0033198 A1 | 2/2006 | Noma et al. |
| 2007/0145420 A1 | 6/2007 | Okada et al. |
| 2008/0164553 A1 | 7/2008 | Lin et al. |
| 2008/0191343 A1 * | 8/2008 | Liu ............................... 257/723 |

* cited by examiner

1

ELECTRONIC DEVICE WAFER LEVEL SCALE PACKAGES AND FABRICATION METHODS THEREOF

CROSS REFERENCE

This application is a Continuation of U.S. application Ser. No. 11/987,232, filed on Nov. 28, 2007 and entitled "ELECTRONIC DEVICE WAFER LEVEL SCALE PACKAGES AND FABRICATION METHODS THEREOF", now U.S. Pat. No. 7,981,727, which claims priority of Taiwan Patent Application No. 096131455, filed on Aug. 24, 2007, the entirety of which are incorporated by reference herein.

BACKGROUND OF THE INVENTION

1. Field of the Invention

The invention relates to electronic device wafer level packages, and more particularly to CMOS image sensing device wafer level packages and fabrication methods thereof.

2. Description of the Related Art

CMOS image sensors are used in a wide variety of applications, such as digital still cameras (DSC). These devices utilize an array of active pixels or image sensor cells, comprising photodiode elements, to receive electromagnetic radiation to convert images to streams of digital data.

Chip scale packages (CSPs) are designed for flip chip bonding to a supporting substrate, such as a package substrate, a module substrate or a printed circuit board (PCB). With flip chip bonding, bumps, pins or other terminal contacts on the package, are bonded to mating contacts on the supporting substrate. The bonded terminal contacts provide the physical and electrical connections between the package and the supporting substrate.

To solve bonding connection problems, a shellcase semiconductor device chip scale packaging technique has been developed. For example, U.S. Pat. No. 6,792,480, and U.S. Pub. No. 2001/0018236, the entireties of which are hereby incorporated by references, disclose semiconductor chip scale packaging techniques. T-shaped connections between the substrate bonding contact and the die bonding contacts are provided. FIG. 1A is a cross section illustrating a conventional CMOS image sensing device wafer level package. FIG. 1B is an enlarged view of region 1B of FIG. 1A. Referring to FIG. 1A, a CMOS image sensing package includes a transparent substrate 24 configured as a support structure for a chip scale package. A CMOS image sensor die 12 with a die circuitry is attached on the transparent substrate 24. The CMOS image sensor die 12 comprises a sensor area with a micro-lens array 10 configured as an image sensing plane. A spacer 26 is disposed between the transparent substrate 24 and the CMOS image sensor die 12 defining a cavity 30. Encapsulant layers 14 and 28 are formed on the substrate encapsulating the CMOS image sensor die 12. An optical structure 16 is disposed on the encapsulant layer 14 to strengthen the chip scale package. One end of a T-shaped connection 18 extends from the die circuitry to a plurality of terminal contacts of the chip scale package, while another end of the T-shaped connection 18 connects to contact pads 22. A ball grid array 20 is formed on the terminal contacts of the chip scale package.

Referring to FIG. 1B, the contact area 18a between the T-shaped connection 18 and contact pads 22 is so small that weak spots are vulnerable to peeling and low reliability.

Accordingly, there is a market demand for an electronic device chip scale package design, whereby conductivity and adhesion between the T-shaped connection and contact pads are ameliorated.

BRIEF SUMMARY OF THE INVENTION

Embodiments and aspects of the invention provide CMOS image sensor wafer level packages and fabrication methods thereof Contact area ladder structures are provided between the T-shaped connection and contact pads to ameliorate conductivity and adhesion therebetween.

The invention provides a fabrication method for an electronic device chip scale package, comprising: providing a semiconductor wafer with a plurality of electronic devices thereon; bonding the semiconductor wafer with a supporting substrate and thinning the back of the semiconductor wafer; etching the back of the semiconductor wafer to create a first trench; conformably depositing an insulating layer on the back of the semiconductor wafer; etching the insulator layer at the bottom of the first trench to create a second trench; sequentially removing the insulating layer and a portion of the inter-layered dielectric (ILD) layer to expose part of a pair of contact pads; conformably depositing a conductive layer on the back of the semiconductor wafer and patterning the conductive layer, thereby creating an S-shaped connection constructed by the conductive layer and the contact pad construct; and forming exterior connections and terminal contact pads connecting to the S-shaped connection.

The invention further provides a wafer level package of electronic devices, comprising: a semiconductor wafer with a plurality of electronic devices thereon bonded with a supporting substrate, wherein each electronic device comprises a pair of contact pads and an inter-layered dielectric (ILD) covered thereon exposing a vertical portion and a horizontal portion; and a conductive layer disposed on the exterior of the wafer level package of electronic devices and conformably contacting the exposed vertical and horizontal portions of the pair of contact pads, thereby constructing an S-shaped connection, wherein the S-shaped connection extends to a plurality of contact terminals on the back of the wafer level package of electronic devices.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1A:
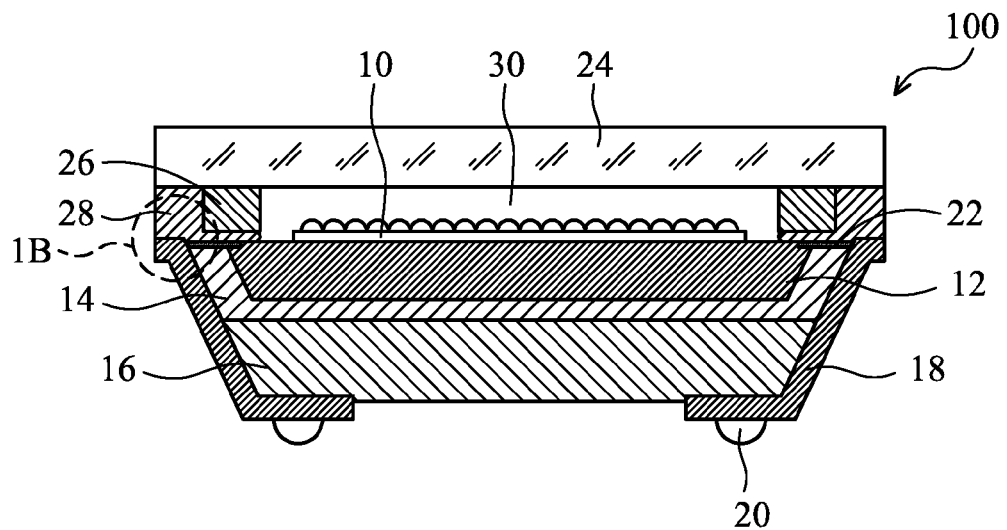
FIG. 1A is a cross section illustrating a conventional CMOS image sensing device wafer level package.
Figure 1B:
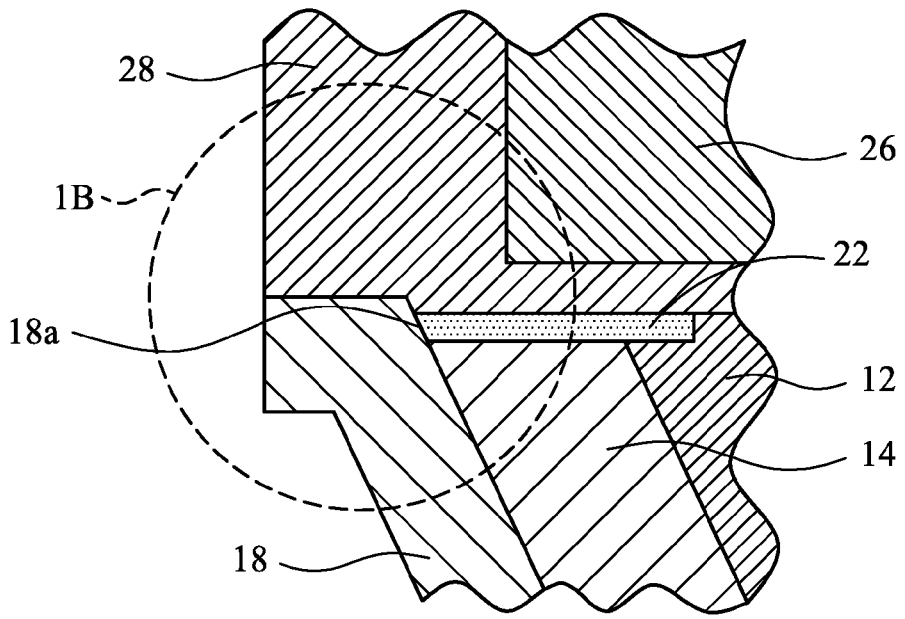
FIG. 1B is an enlarged cross-sectional view of region 1B of FIG. 1A.

It is to be understood that the following disclosure provides many different embodiments or examples for illustrating different features of various embodiments. Specific examples of components and arrangements are described below to simplify the present disclosure. These are merely examples and are not intended to be limiting. In addition, the present disclosure may repeat reference numerals and/or letters in the various examples. This repetition is for the purpose of simplicity and clarity and does not in itself indicate a relationship between the various embodiments and/or configurations discussed.

Figure 2:
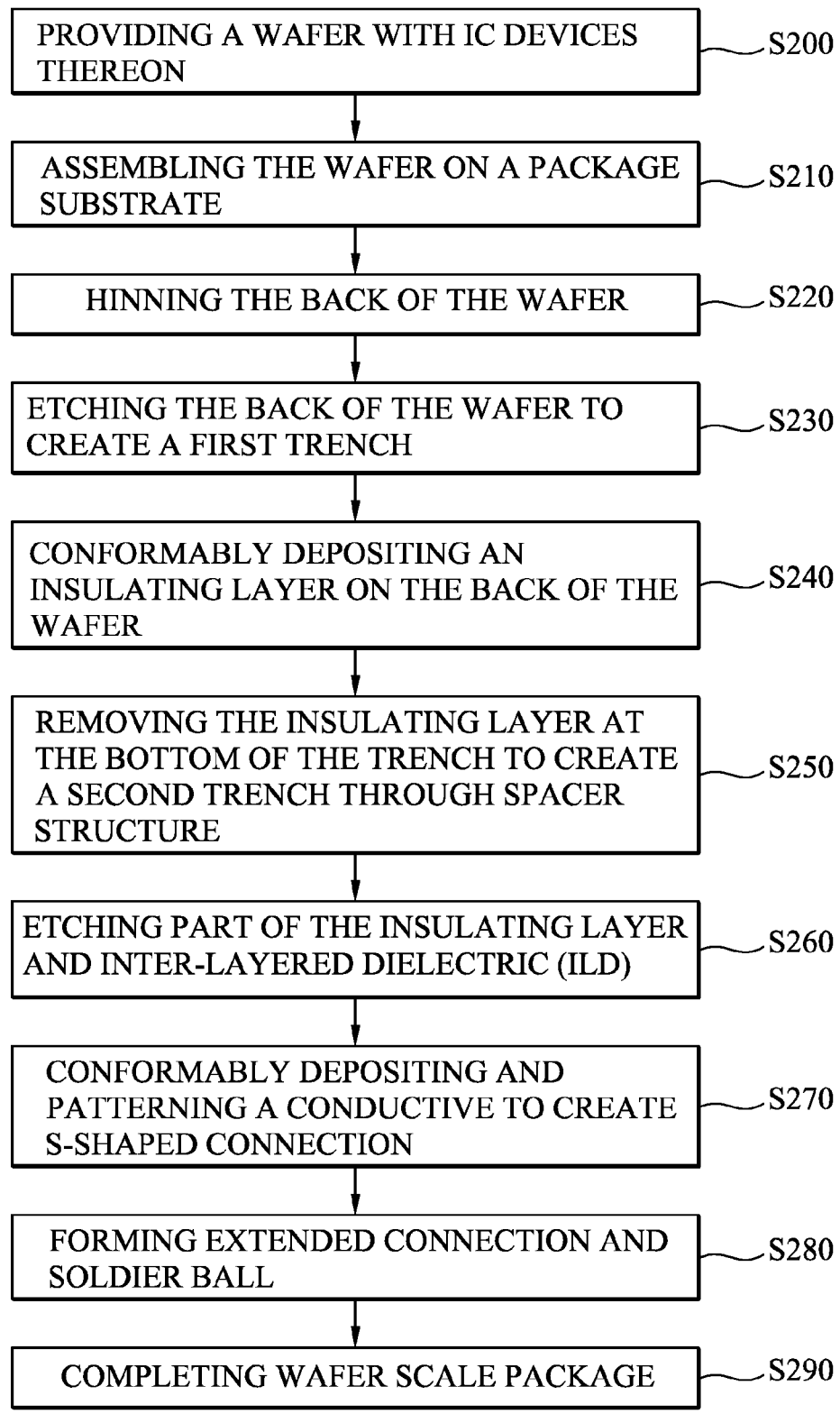
FIG. 2 is a flowchart illustrating an exemplary embodiment of a fabrication method for an electronic device wafer level package according to the invention.

FIG. 2 is a flowchart illustrating an exemplary embodiment of a fabrication method for an electronic device wafer level package according to the invention. First, a wafer with IC devices thereon is provided (Step S200). Wherein a plurality of electronic devices, such as CMOS image sensors and corresponding micro-lens arrays have been formed on a semiconductor wafer. Subsequently, in step S210, the wafer is bonded on a package substrate. The back of the semiconductor wafer is then thinned in order to achieve thinner and lighter assembly (step S220). The back of the semiconductor wafer is further etched to create a first trench (step S230), thereby exposing an inter-layered dielectric (ILD) layer of the CMOS image sensing devices. An insulating layer is conformably deposited on the back of the semiconductor wafer (step S240). Next, referring to step S250, a portion of the insulating layer and ILD layer at the bottom of the first trench is removed to create a second trench deepening into a dam structure. For step S260, the insulating layer and ILD at the bottom of the first trench is sequentially removed, thereby exposing a horizontal surface and a vertical surface of the contact pads. Next, a conductive layer is conformably deposited and then patterned into an S-shaped connection (step S270). Then, an extended connection and a soldier ball array are sequentially formed in step S280. Following, other steps not shown but are well-known for those with ordinary skill in the art are undertaken to complete the wafer scale package (step S290).

As key feature and main aspect of the invention, is that the insulating layer at the bottom of the trench and the ILD layer are sequentially removed to expose a horizontal surface and a vertical surface of the contact pads, such that a larger contact area between the subsequently formed conductive layer and the contact pads are formed, thereby ameliorating conductivity and adhesion of the S-shaped connection and improving production yield.

Figure 3A:
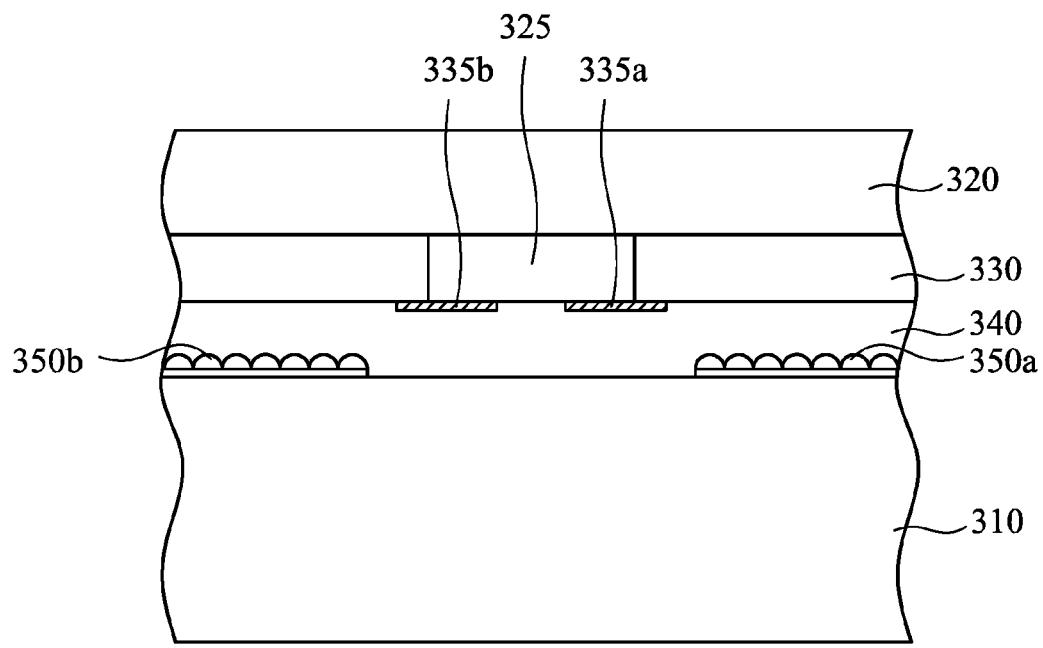
FIGS. 3A-3I are cross sections illustrating an exemplary embodiment of steps for fabricating a CMOS image sensor wafer level package according to the invention.

FIGS. 3A-3I are cross sections illustrating an exemplary embodiment of steps for fabricating a CMOS image sensor wafer level package according to the invention. Referring to FIG. 3A, a transparent substrate 320 is provided to serve as a carrier substrate of a wafer level package. The transparent substrate 320 is composed of lens quality glass or quartz. A semiconductor wafer 310 includes a plurality CMOS image sensing devices, corresponding internal circuits, and micro-lens arrays 350a and 350b to serve as an image sensing plane. The corresponding internal circuits of each CMOS image sensing device are extended and connected to contact pads 335a and 335b. An ILD layer 340 or passivation layer, is disposed on the internal circuits of each CMOS image sensing device and the micro-lens arrays 350a and 350b.

The semiconductor wafer 310 and the transparent substrate 320 are oppositely assembled with a dam structure 325 or spacer interposed therebetween. A cavity 330 is thus formed between the semiconductor wafer 310 and the transparent substrate 320.

Figure 3B:
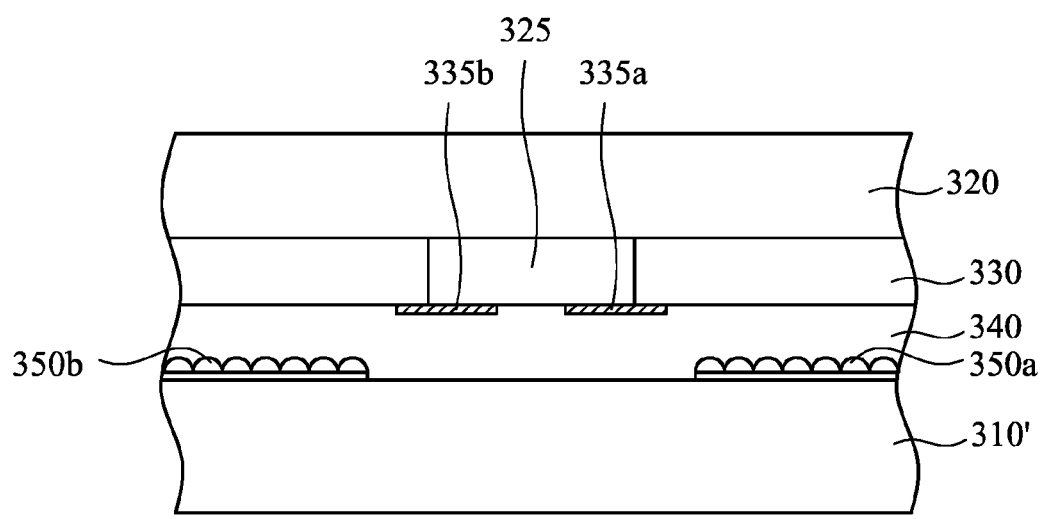

Referring to FIG. 3B, in order to meet advanced packaging processes and to fabricate ultra-thin packages, the back of the semiconductor wafer 310 is thinned to a predetermined thickness 310'. The thinning procedure can be performed by grinding, chemical mechanical polishing (CMP), or an etching back process.

Figure 3C:
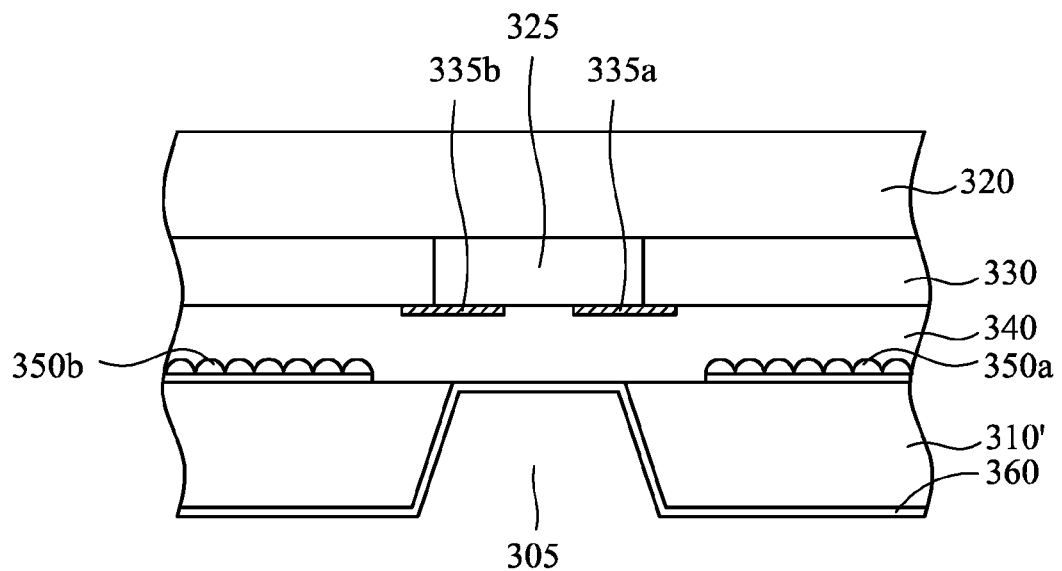

Referring to FIG. 3C, the thinned back of the semiconductor wafer 310' is then patterned to create a first trench 305 through the semiconductor wafer exposing an ILD layer 340.

For example, the thinned back of the semiconductor wafer 310' is etched by lithographically etching until exposing the ILD layer 340. Subsequently, an insulating layer 360 is conformably deposited on the back of the semiconductor wafer 310'. Deposition of the insulating layer 360 can be performed by spray coating, sputtering, printing, application or spin coating. The insulating layer 360 can be made of epoxy, polyimide, resin, silicon oxide, metal oxide, or silicon nitride.

Figure 3D:
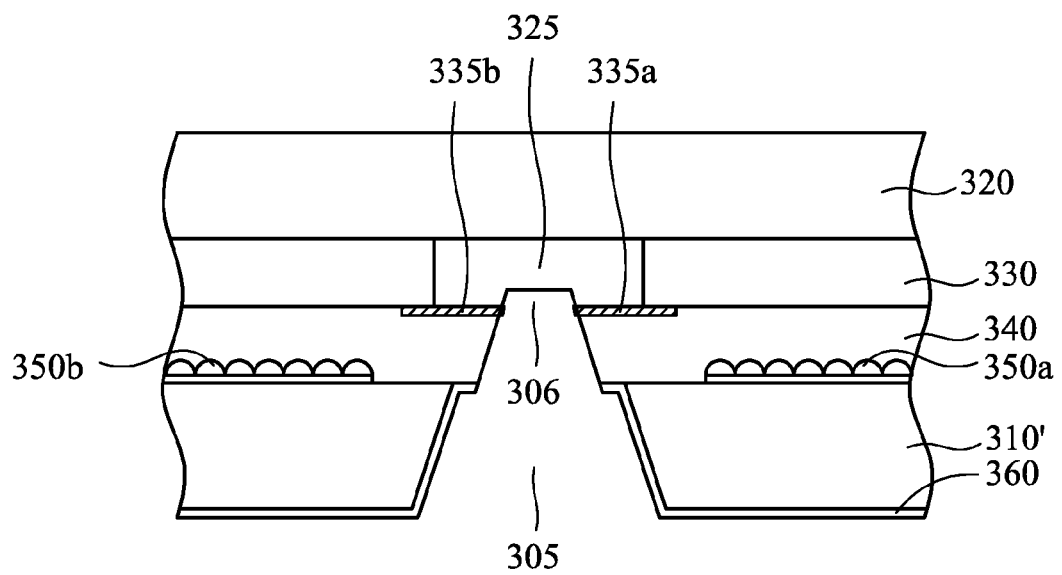

Referring to FIG. 3D, the insulating layer 360 at the bottom of the first trench 305 and part of the ILD layer 340 are removed to create a second trench 306 deepening into the dam structure 325. For example, a photo mask (not shown) is formed on the insulating layer 360 exposing the desired etched region. Etching steps of the exposed insulating layer 360 and ILD layer 340 are then sequentially performed to remove the insulating layer 360 and ILD layer 340 at the bottom of the first trench 305. After creation of the second trench, the photo mask is stripped.

Figure 3E:
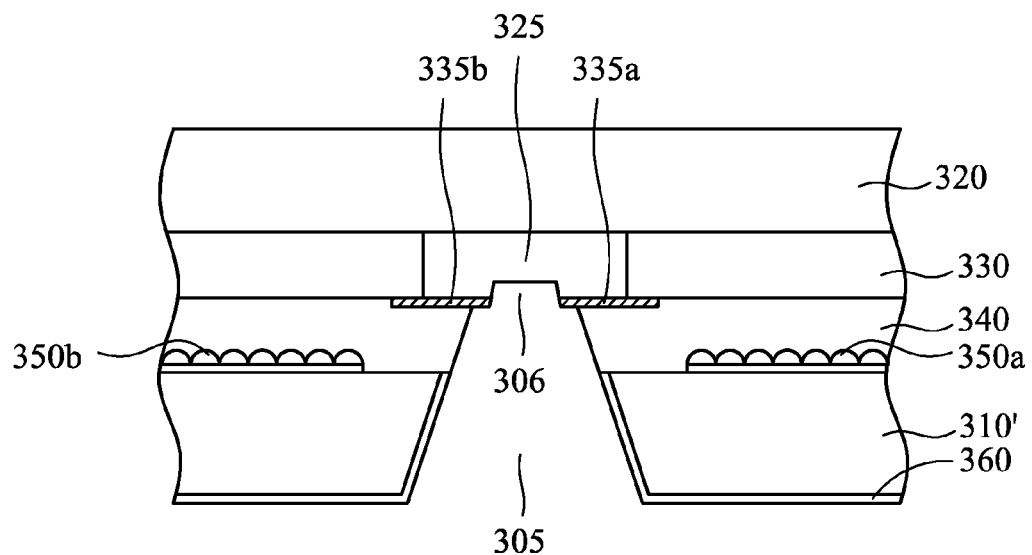

Referring to FIG. 3E, the exposed portion of the insulating layer 360 and ILD layer 340 are sequentially removed until exposing the contact pads 335a and 335b. Note that the abovementioned removal process is performed by etching along the extension of the sidewall of the second trench 306 until exposing the contact pads 335a and 335b. For example, the contact pad 335a exposes a vertical surface v and a horizontal surface h in the second trench 306, as shown in FIG. 3G.

Figure 3F:
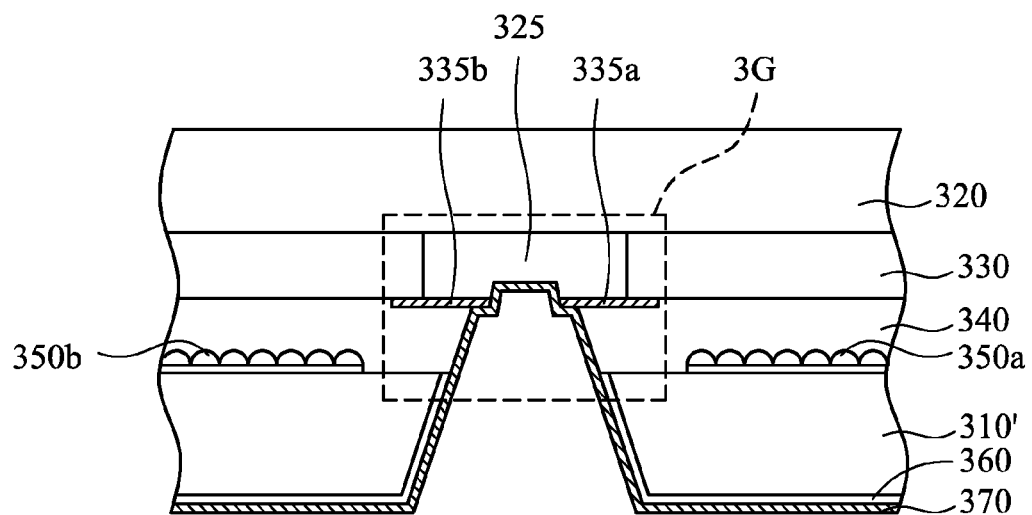
Figure 3G:
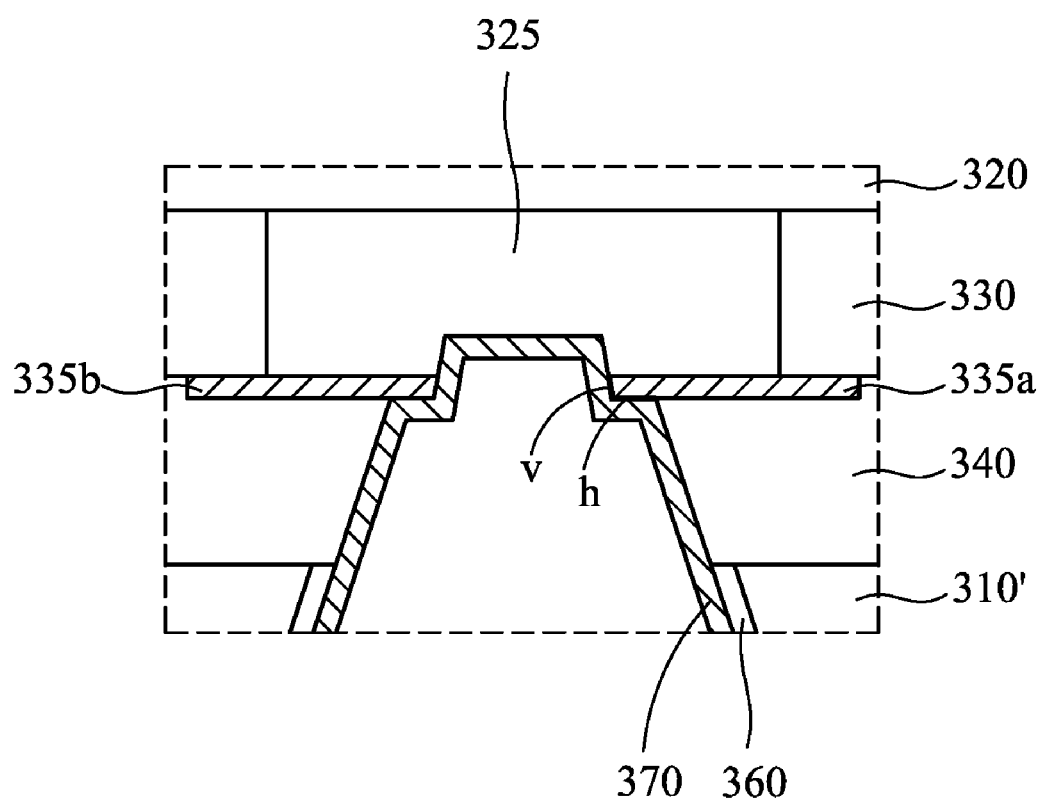

Referring to FIG. 3F, a conductive layer 370 is conformably deposited on the back of the semiconductor wafer and then patterned into conductive lines. The patterned conductive layer 370 and the contact pads 335a and 335b are configured as an S-shaped connection. According to embodiments of the invention, since, in the second trench 306, the contact pads include double step structures with vertical contact portion v and horizontal contact portion h, the following deposited conductive layer 370 can create better adhesion therebetween. Moreover, as the contact area between the conductive layer 370 and the contact pads 335a and 335b increases, conductivity therebetween also improves.

Figure 3H:
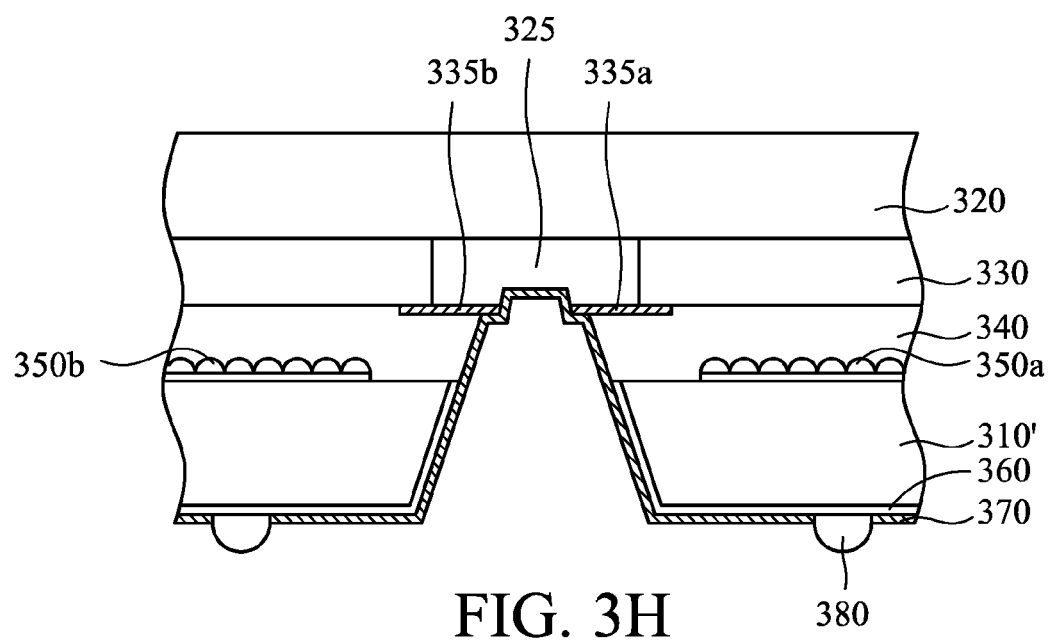
Figure 3I:
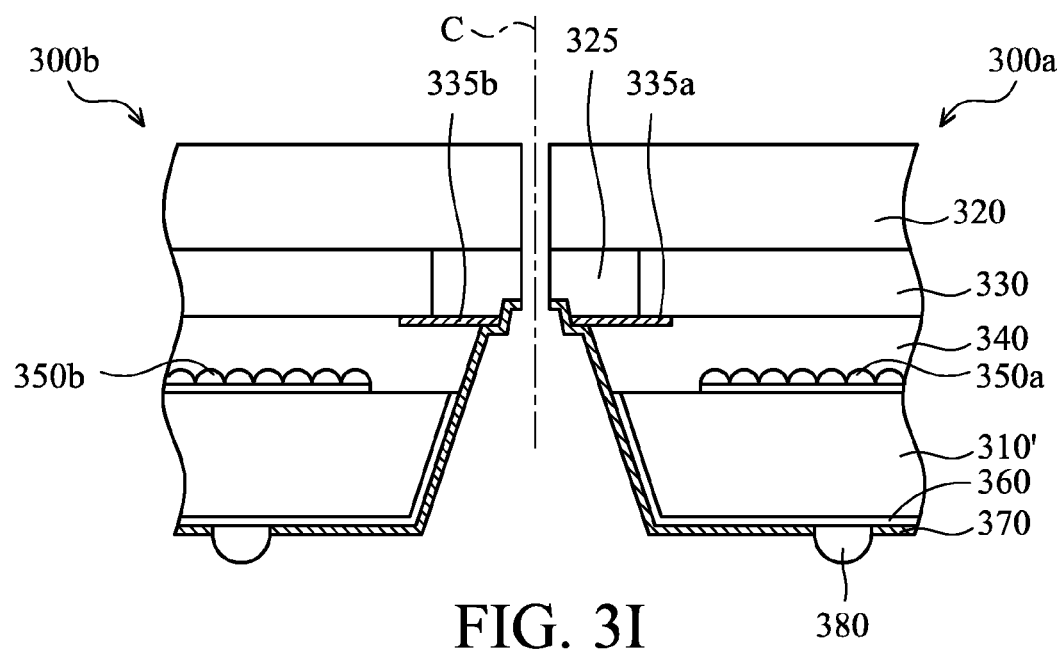

Referring to FIG. 3H, a ball grid array 380 is formed on the terminal contacts for the electronic device package. For example a solder masker layer (not shown) is formed on the chip scale package exposing the predetermined terminal contact area. An array of solder balls 380 is formed on the exposed terminal contact area. Subsequently, the wafer scale assembly of CMOS image sensing device is cut along the cutting line C into a individual CMOS image sensing device package 300a~300b as shown in FIG. 3I. Note that there are additional steps not mentioned here, which are required to complete the CMOS image sensing device wafer level package, but which are not essential to an understanding of the invention and well-known to those with ordinary skill in the art.

Although this exemplary embodiment has been described in conjunction with an example of a CMOS image sensor chip scale package, the features of the invention may also be applied to other electronic device chip scale packages comprising an integrated circuit device, an optoelectronic device, an electromechanical device, or a surface acoustic wave (SAW) device.

The CMOS image sensing device package, thus formed by an embodiment of the invention, comprises a semiconductor wafer with a plurality of electronic devices thereon bonded with a supporting substrate. Each electronic device comprises a pair of contact pads and an inter-layered dielectric (ILD) covered thereon exposing a vertical portion and a horizontal portion. A conductive layer is disposed on the exterior of the wafer level package of electronic devices and conformably contacts the exposed vertical and horizontal portions of the pair of contact pads, thereby constructing an S-shaped connection. The S-shaped connection extends to a plurality of contact terminals on the back of the wafer level package of electronic devices.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fabrication method for an electronic device chip scale package, comprising:
   providing a semiconductor wafer with a plurality of electronic devices thereon;
   bonding the semiconductor wafer with a supporting substrate and thinning the back of the semiconductor wafer;
   etching the back of the semiconductor wafer to create a first opening;
   conformably depositing an insulating layer on the back of the semiconductor wafer;
   etching the insulating layer at the bottom of the first opening and creating a second opening exposing part of contact pads, the exposed part of the contact pads comprising a vertical portion and a horizontal portion, wherein the second opening extends over upper surfaces of the contact pads, and lower surfaces of the contact pads are between the upper surfaces and the semiconductor wafer;
   after the second opening is created, conformably depositing a conductive layer on the back of the semiconductor wafer and patterning the conductive layer, thereby creating an S-shaped connection constructed by the conductive layer and the contact pads;
   forming exterior connections and terminal contact pads connecting the S-shaped connection; and
   forming a dam structure between the semiconductor wafer and the supporting substrate, wherein the second opening extends into the dam structure, and a bottom surface of the second opening is between upper surfaces of the dam structure and the upper surfaces of the contact pads.

2. The fabrication method as claimed in claim 1, wherein the plurality of electronic devices comprise an integrated circuit device, an optoelectronic device, an electromechanical device, or a surface acoustic wave (SAW) device.

3. The fabrication method as claimed in claim 2, wherein the optoelectronic device comprises a CMOS image sensing device.

4. The fabrication method as claimed in claim 1, wherein the supporting substrate is transparent comprising lens quality glass or quartz.

5. The fabrication method as claimed in claim 1, wherein deposition techniques of the insulating layer comprises spray coating, sputtering, printing, application and spin coating.

6. The fabrication method as claimed in claim 1, wherein the insulating layer comprises epoxy, polyimide, resin, silicon oxide, metal oxide, or silicon nitride.

7. The fabrication method as claimed in claim 1, after deposition of the insulating layer, further comprising:
   forming a patterned mask layer on the insulating layer exposing the insulating layer at the bottom of the first opening; and
   etching the exposed insulating layer at the bottom of the first opening using the patterned mask layer.

8. The fabrication method as claimed in claim 1, further comprises cutting the semiconductor wafer and the supporting substrate to divide each electronic device chip scale package.

9. The fabrication method as claimed in claim 1, wherein the conductive layer extends into the second opening.

10. The fabrication method as claimed in claim 9, wherein the conductive layer conformally extends on a bottom and a sidewall of the second opening.

* * * * *